United States Patent
Yang et al.

(10) Patent No.: US 10,636,493 B2
(45) Date of Patent: Apr. 28, 2020

(54) RELAXED ERASE PARAMETERS FOR BLOCK ERASURES IN NON-VOLATILE STORAGE MEDIA

(71) Applicant: Western Digital Technologies, Inc., San Jose, CA (US)

(72) Inventors: Niles Yang, Mountain View, CA (US); Pitamber Shukla, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/020,742

(22) Filed: Jun. 27, 2018

(65) Prior Publication Data

US 2020/0005875 A1   Jan. 2, 2020

(51) Int. Cl.

| | | |
|---|---|---|
| *G11C 16/16* | (2006.01) | |
| *G11C 16/34* | (2006.01) | |
| *G06F 11/10* | (2006.01) | |
| *G11C 29/00* | (2006.01) | |
| *G11C 29/52* | (2006.01) | |

(52) U.S. Cl.
CPC .......... *G11C 16/16* (2013.01); *G06F 11/1068* (2013.01); *G11C 16/3445* (2013.01); *G11C 16/3495* (2013.01); *G11C 29/52* (2013.01); *G11C 29/765* (2013.01); *G11C 29/82* (2013.01)

(58) Field of Classification Search
CPC ......... G11C 16/16; G11C 29/82; G11C 29/52; G11C 16/3495; G11C 29/765; G11C 16/3445; G06F 11/1068
See application file for complete search history.

(56) References Cited

U.S. PATENT DOCUMENTS

| | | | |
|---|---|---|---|
| 8,400,854 B2 | 3/2013 | Pei et al. | |
| 9,378,809 B1* | 6/2016 | Srinivasan | ............... G11C 7/00 |
| 2012/0033503 A1* | 2/2012 | Kim | ........................ G11C 16/16 |
| | | | 365/185.33 |
| 2015/0134885 A1* | 5/2015 | Yeung | ................. G06F 12/0246 |
| | | | 711/103 |
| 2015/0186072 A1* | 7/2015 | Darragh | ................. G06F 3/0653 |
| | | | 711/103 |
| 2015/0303948 A1* | 10/2015 | Yoon | ...................... G11C 29/52 |
| | | | 714/764 |
| 2019/0115081 A1* | 4/2019 | Lee | ........................ G11C 16/08 |

* cited by examiner

*Primary Examiner* — Jerome Leboeuf

(57) ABSTRACT

Dynamic modification of health metrics for data blocks in non-volatile storage media based on erase operation loop counts. In one implementation, a method includes iteratively erasing a block of non-volatile storage media until a count of non-erasable bits satisfies criteria comprising an allowable non-erasable bits parameter, and determining that a number of iterations needed to erase the block exceeds a threshold number of iterations. The method further includes, in response to the number of iterations exceeding the threshold number of iterations, increasing the allowable non-erasable bits parameter for a subsequent erasure of the block.

17 Claims, 9 Drawing Sheets

RELAXED ERASE PARAMETERS FOR BLOCK ERASURES IN NON-VOLATILE STORAGE MEDIA

TECHNICAL FIELD

Aspects of the disclosure are related to the field of non-volatile storage media and associated parameters and operations.

BACKGROUND

Non-volatile storage media, such as flash storage memory in a solid-state storage device, thumb-drive, or the like, includes memory cells made of transistors that store data in a non-volatile manner. This non-volatile storage media may be employed within computers, smartphones, tablets, and many other types of computing devices.

In many examples of non-volatile storage media, the storage media may deteriorate over time based on how heavily it is used. As an example, a flash memory device may have various types of bridges between word lines, between a word line and a channel, and between a word line and a common source line. A defect may occur in the flash memory device due to construction of these bridges and the materials used in the bridges.

To enhance the lifetime of these storage devices, the non-volatile storage media may be configured into blocks, wherein entire blocks may be erased by a storage controller to limit the number of writes that are subjected to the cells of the storage device. However, although limiting the number of times that blocks are erased ensures a greater longevity for the non-volatile storage media, set erased parameters, such as allowed non-erasable bits or non-erasable cells that are used to classify a block as healthy, may unnecessarily shorten the lifespan of the storage device.

OVERVIEW

Storage systems are provided herein to relax erase parameters in non-volatile storage media based on a loop count during an erase operation. In at least one implementation, a storage controller erases a block of non-volatile storage media and maintains a loop count for the erasure. The controller further determines when the loop count satisfies a threshold loop count for the erasure of the block and, when the loop count satisfies the threshold loop count for the erasure of the block, relaxes an erase parameter for a later erasure of the block.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
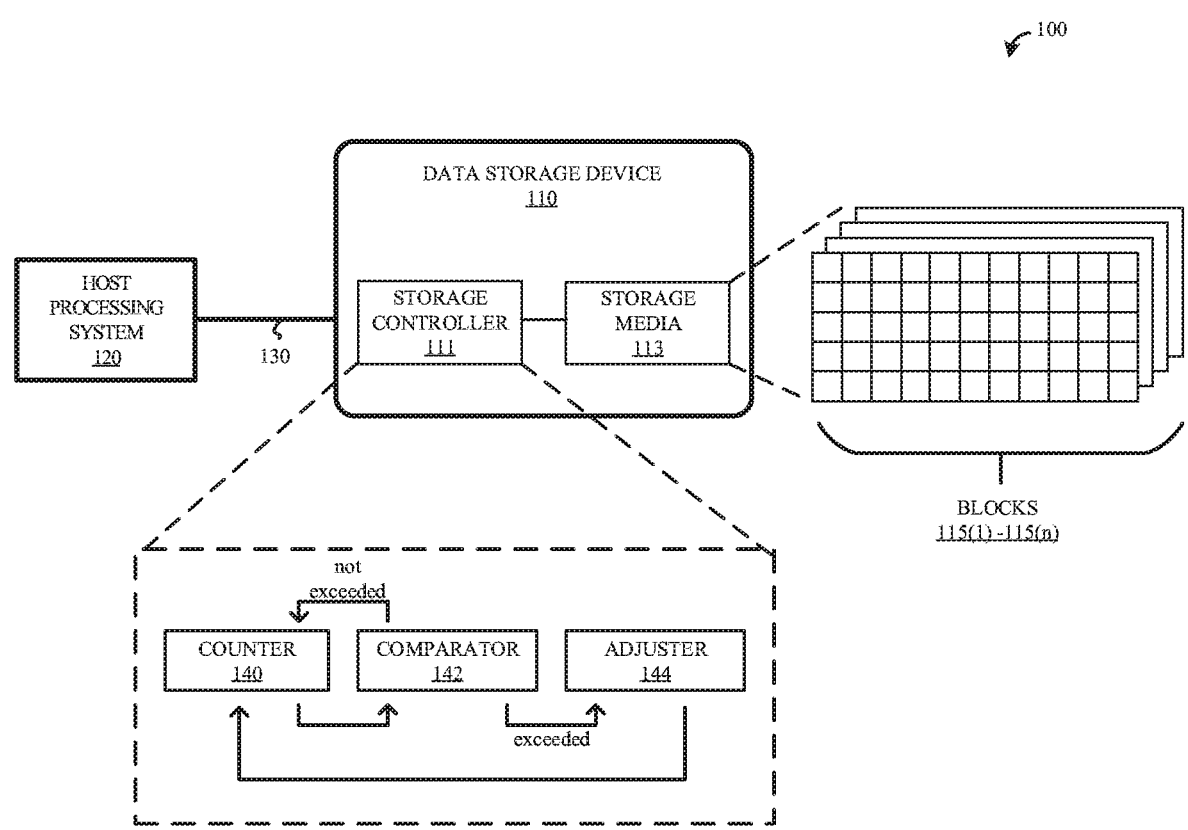
FIG. 1 illustrates a computing system to relax erase parameters according to an implementation.

A storage device can include non-volatile storage media, such as flash storage media, that is operatively coupled to a storage controller. The storage controller manages the storing of data to the storage media and the erasure of blocks and corresponding cells in the storage media. In particular, when a block is to be erased, often in response from a TRIM command from a host processing system operatively coupled to the storage device, the storage controller may apply voltage to silicon substrates of cell transistors in the block to place each of the cells in an erased state. In applying the voltage, the controller may be apply the voltage in loops or iterations, wherein each loop may apply voltage for a particular amount of time to each of the cells until the cells are placed in an erased state (i.e. the read voltage for the cell placed at an erased state value).

While the erase loops are implemented for the block, the storage controller may maintain a loop count indicating the number of loops that were required to place the entire block into an erased state. This erased state for the block often occurs when a threshold quantity of non-erasable bits remain in the block. For example, during an erase operation, the storage controller may monitor for when the quantity of non-erasable bits is less than thirty-eight.

Consequently, when a erasure loop decreases the quantity of non-erasable bits from forty from a previous erasure loop to thirty-five, the block may be considered to be in an erased state. Once in the erased state, the loop count for the erasure may be compared to a threshold loop count to determine whether the loop count satisfies the threshold loop count. If the loop count did not satisfy the threshold loop count, or fell below the threshold loop count, then the block may be considered healthy and no action may be taken on the block.

In contrast, if the loop count did satisfy the loop count threshold, then the storage controller may implement various operations to relax at least one health parameter related to the data block. These relaxed health parameters may include modifying the allowable non-erasable bits value for the block during the next erasure, identifying word-lines (or segments in the block) that should not be counted when determining the quantity of non-erasable bits in the block during the next erasure, or modifying some other health parameter for the block. In some implementations, in addition to modifying a health parameter for the block the storage controller may further increase data scrubbing for the block, reclassify the block from hot storage (storage for data that is frequently accessed) to cold storage (data that is less frequently accessed), identify the block as unable to store future data, or some other similar operation.

In at least one implementation, when the loop count exceeds or satisfies the threshold loop count, the controller may identify one or more word-lines with the most non-erasable bits (or large clusters of non-erasable bits) and classify the one or more word-lines as no longer to be used in calculating the non-erasable bits in the block and/or classifying the word-lines as no longer available to store data.

In some implementations, the word-line with the most non-erasable bits may be identified after each erasure instance that the block exceeds the threshold loop count. For example, a first word-line may be classified as no longer used to calculate the non-erasable bits in the block after the loop count is exceeded during a first erasure, while a second word-line may be classified as no longer used to calculate the non-erasable bits in the block after the loop count is exceeded at a second erasure. As the word-lines are identified and marked, the quantity of work-lines may be used as criteria to increase data scrubbing for the block, reclassify the block from hot storage to cold storage, identify the block as unable to store future data, or some other similar operation.

FIG. 1 illustrates a computing system 100 to relax erase parameters according to an implementation. Computing system 100 includes host processing system 120 and data storage device 110, wherein data storage device 110 further includes storage controller 111 operatively coupled with storage media 113. Host processing system communicates with data storage device 110 via communication link 130, wherein communication link 130 may comprise a Small Computer System Interface (SCSI) bus, a Serial Attached SCSI (SAS) bus, a Serial Advanced Technology Attachment (SATA) bus, a Peripheral Component Interconnect Express (PCIe) bus, Fibre Channel, or some other similar interface or bus.

Storage media 113 is representative of non-volatile storage media, such solid-state storage media and flash media, that is used as a form of static memory whose data is saved when a computer is turned off or loses its external power source. Storage media 113 comprises blocks 115(1)-115(n) of storage media that each include a defined number of cells. These cells may be configured as multilayer cells (MLC), wherein multiple bits may be stored by any one cell, or may be configured as single layer cells (SLC), wherein a single bit may be stored by each of the cells. In maintaining storage for storage media 113, storage media 113 is coupled to storage controller 111, wherein storage controller 111 includes counter 140, comparator 142, and adjuster 144, which may be implemented on a variety of forms of processing circuitry. This processing circuitry may include an field programmable gate array (FPGA), one or more application-specific integrated circuits (ASICs), or some other similar logical circuits to implement the required operations.

Further, in addition to or in place of the logical circuits, storage controller 111 may comprise a processing system operatively coupled to a storage system. The processing system may comprise microprocessor and other circuitry that retrieves and executes operating software from the storage system. The storage system may include volatile and nonvolatile, removable and non-removable media implemented in any method or technology for storage of information, such as computer readable instructions, data structures, program modules, or other data. The storage system may be implemented as a single storage device, but may also be implemented across multiple storage devices or subsystems. The storage system may comprise additional elements, such as a controller to read operating software from the storage systems. Examples of storage media include random access memory, read only memory, magnetic disks, optical disks, and flash memory, as well as any combination or variation thereof, or any other type of storage media. In some implementations, the storage media may be a non-transitory storage media. In some instances, at least a portion of the storage media may be transitory. It should be understood that in no case is the storage media a propagated signal.

The processing system is typically mounted on a circuit board that may also hold the storage system. The operating software of the storage system comprises computer programs, firmware, or some other form of machine-readable program instructions. The operating software of the storage system is capable of providing the erasure operations described herein for a storage controller. The operating software on the storage system may further include an operating system, utilities, drivers, network interfaces, applications, or some other type of software or firmware. When read and executed by the processing system the operating software on the storage system direct the controller to operate as described herein.

During the operation of storage device 110, blocks of storage within the storage media may be erased as part of the program-erase cycle or operation for the device, wherein a program-erase cycle comprises a sequence of events in which data is written to the block, erased on the block, and new data written to the block. In particular, rather than overwriting data to individual cells within a block, many storage systems require that an entire block of data be erased during an erase operation. For example, when the data within block 115(1) is no longer valid, the cells within the block may be marked causing the block to be erased. To erase the blocks, storage controller 111 may initiate an erase operation, wherein voltage is applied to the silicon substrate of the cells within the block to place each of the cells in an erased state.

In applying the voltage, the voltage may be applied in loops to limit the amount of damage applied to the block during an erase operation. For example, a first cell may take an applied voltage a first amount of instances to place the cell into an erased state, while a second cell may take an applied voltage a second amount of instances to place the cell into an erased state.

During the erasure of a block, counter 140 is used to count the number of times that voltage is applied to the cells in the block as part of an erase operation to place the block into what is considered an "erased state." This erased state associated with the block, in some implementations, is based on the quantity of non-erasable bits in the block. For example, voltage may be applied in cycles or loops to the cells of the block until the quantity of non-erasable bits is below a threshold quantity of non-erasable bits. In particular, after the voltage is applied for an erase loop, storage controller 111 may determine the quantity of non-erased bits that remain in the block, and based on the quantity (e.g. whether the quantity satisfies an allowable non-erasable bits value), determine whether the block is in an erased state. If the block is in an erased state, then the erase process is complete. In contrast, if the block is not in an erased state, the erase process will continue by implementing another erase loop of applying voltage to the cells in an attempt to place additional cells in an erased state.

In the present implementation, counter 140 is used to monitor the number of loops that are required to place the block in the erased state. Once the block is placed in the erased state (e.g. by the number of non-erased bits satisfying an allowable non-erasable bits value), comparator 142 determines whether the loop count satisfies a threshold loop count for the erasure of the block. For example, comparator 142 may be assigned a loop count threshold value to determine when the block is in a healthy state. Accordingly, if the number of loops to erase a block did not exceed or satisfy the threshold loop count, then the block may be considered healthy and counter 140 may again be used to monitor the loop count during the next erasure of the block.

In contrast, if the loop count did exceed or satisfy the threshold, then adjuster 144 may be used to relax an erase parameter for the block, wherein the erase parameter may comprise an allowable non-erasable bits value associated with the block, an allowable non-erasable cells value with the block, or some other similar erase parameter associated with the particular block. Once adjuster 144 relaxes the erase parameter, and the block is designated for another erase operation, the operations of storage controller 111 are reverted again to counter 140, wherein counter 140 monitors a loop count for erasing the cells in the block during the second erasure.

In some examples, in addition to adjusting the erase parameter, adjuster 144 may provide additional operations with respect to block. These operations may include identifying at least one word-line (or segment of cells) with greatest number of non-erasable bits. Once identified, the word-line may be marked, such that the word-line is no longer used to store data and/or such that the word-line is no longer to be used in calculating the non-erasable bits of the block. Additionally, as word-lines are marked each time the loop count exceeds the threshold for the block, further operations may be applied to the block based on the quantity of word-lines that have been marked. In particular, the quantity of word-lines marked may be compared to criteria to increase data scrubbing for the block, criteria to reclassify the block from hot storage to cold storage, criteria to mark the block as unable to store future data, criteria to reclassify the block from MLC to SLC if available, or criteria to trigger some other similar operation with respect to the block.

In some implementations, the operations of the storage controller to monitor the loop count may only occur based on the lifespan of the device. In at least one example, when the program erase operations of the storage device meet a mid-point in the devices lifespan, or a mid-point in the total number of erases for the storage media, then the controller may initiate the loop count for the storage media. Although this is one example of when the loop count operation may be initiated, it should be understood that the loop count operation may occur at any other point in the lifespan of the device.

Figure 2:
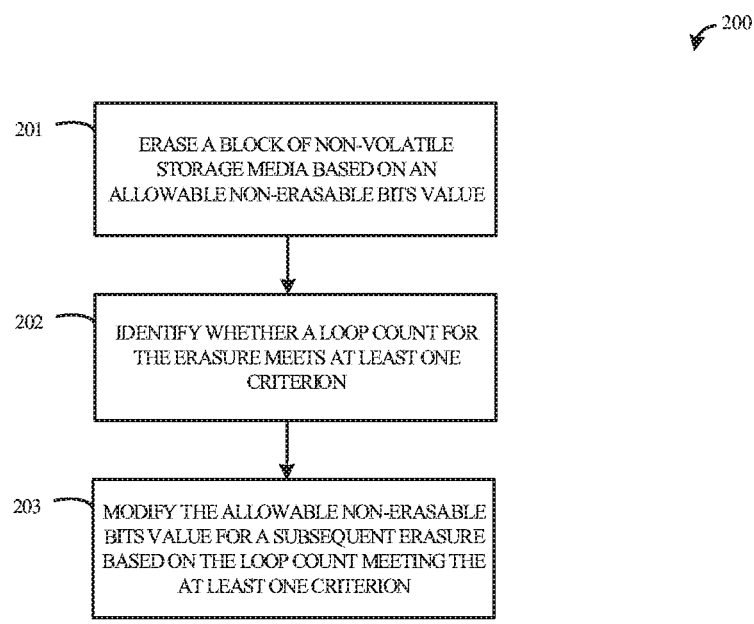
FIG. 2 illustrates an operation of a storage controller to relax erase parameters according to an implementation.

FIG. 2 illustrates an operation 200 of a storage controller to relax erase parameters according to an implementation. The processes of operation 200 are described parenthetically in the paragraphs that follow, and may be implemented by a storage controller, such as storage controller 111 of FIG. 1.

As depicted, operation 200 includes erasing (201) a block of non-volatile storage media based on an allowable non-erasable bits value. In particular, when a block is to be erased, which can be triggered by a TRIM command from a host processing system, a storage controller may iteratively apply voltage to cells of the block to place the cells into an erased state. Once a quantity of non-erasable bits satisfies an allowable non-erasable bits value, then the block may be considered erased.

Once the block is considered erased based on the allowable non-erasable bits value, the storage controller may identify (202) whether a loop count for the erasure meets at least one criterion, and modify (203) the allowable non-erasable bits value for a subsequent erasure of the of the block based on the loop meeting the at least one criterion. In one implementation, the criterion may comprise a threshold quantity of loops, wherein if the loop count exceeds or satisfies the threshold quantity of loops, then the non-erasable bits value may be increased for a subsequent erasure of the block.

In another implementation, the criterion may comprise a threshold quantity of loops, however, a determination may be made whether the loop count falls below or fails to satisfy the threshold quantity of loops. In this example, rather than increasing the allowable non-erasable bits, the storage controller may decrease the allowable non-erasable bits. This decreasing of the non-erasable bits may reduce parity operations that are required when data is stored and read from the block.

In some implementations, when the loop count meeting the at least one criterion comprises exceeding a threshold loop count, the storage controller may further apply additional operations with respect to the block when the threshold is satisfied. These operations may include identifying at least one word-line (or segment of cells) with greatest number of non-erasable bits, and once identified, the word-line may be marked, such that the word-line is no longer used to store data and/or such that the word-line is no longer to be used in calculating the non-erasable bits of the block. Additionally, as word-lines are marked each time the loop count exceeds the threshold for the block, further operations may be applied to the block based on the quantity of word-lines that have been marked. In particular, the quantity of word-lines marked may be compared to criteria to increase data scrubbing for the block, criteria to reclassify the block from hot storage to cold storage, criteria to mark the block as unable to store future data, or criteria to trigger some other similar operation with respect to the block.

Figure 3:
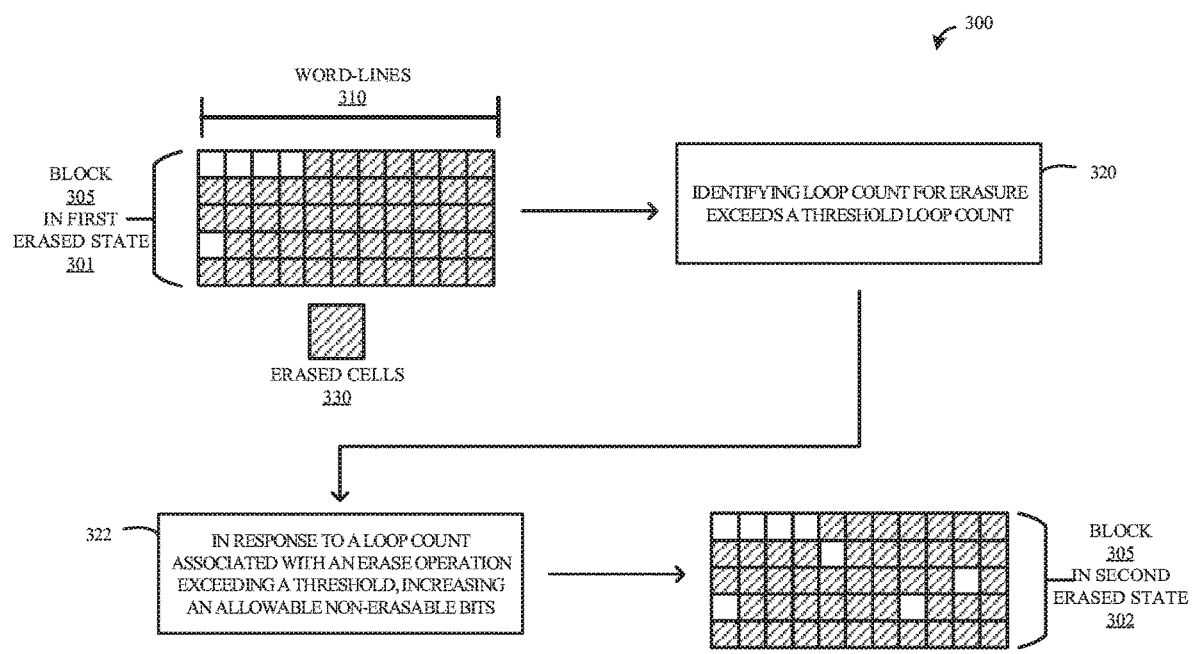
FIG. 3 illustrates an operational scenario of modifying an erase parameter according to an implementation.

FIG. 3 illustrates an operational scenario 300 of modifying an erase parameter according to an implementation. Operational scenario 300 includes block 305 in first erased state 301 and second erased state 302, and further includes operations 320 and 322. Block 305 further includes erased cells 330 generated from performing an erase operation on the block.

As described herein, when an erase operation is performed on block 305, voltage is applied to the silicon substrate of each of the cells in loops until a non-erasable bits value for the block satisfies an allowable non-erasable bits value. Referring to the example in FIG. 3, block 305 in first erased state 301 includes five nonerasable cells, which satisfies the allowable non-erasable bits value for the block. Once the block is determined to be erased based on the allowable non-erasable bits value, operation 320 is performed that identifies when a loop count for the erasure of the block exceeds a threshold loop count. For example, a controller of the non-volatile storage media may be configured with a threshold loop count that can be compared to the number of loops that are required to implement the erasure of the block. When the loop count falls below the threshold or fails to satisfy the threshold, then the controller may determine that the block is healthy. In contrast, when the loop count for the block exceeds the threshold or satisfies the threshold, such as the example demonstrated in operational scenario 300, then operation 322 is performed. Operation 322 directs a controller of the storage device to, in response to the loop count associated with an erase operation exceeding the threshold, increasing an allowable non-erasable bits value for the next erasure of the block. In particular, by modifying the allowable non-erasable bits associated with a particular block, the controller is attempting to modify the number of erase loops that are required to place the block into an erased state.

Referring to the example in FIG. 3, once the allowable non-erasable bits value is increased and a second erase operation is performed, the result is block 305 in second erase state 302, wherein the block in erased state 302 includes a greater number of non-erasable bits than block 305 in erased state 301. While erasing the block to produce erased state 302, the controller may again monitor the quantity of erase loops that are required to place the block into the erased state. If the loop count falls below the threshold, then no action may be taken with respect to the non-erasable bits value. However, if the loop count again satisfies or exceeds the threshold, then the controller may take various actions on the block, including, but not limited to, identifying word-lines or segments in the block that should no longer be used in storing data, identifying word-lines or segments in the block that should no longer be counted when determining the quantity of non-erased bits, changing the block from hot storage for data to cold storage for data, increasing the read scrubbing priority for the block, or reclassifying the block from a MLC storage block to a SLC storage block.

Figure 4:
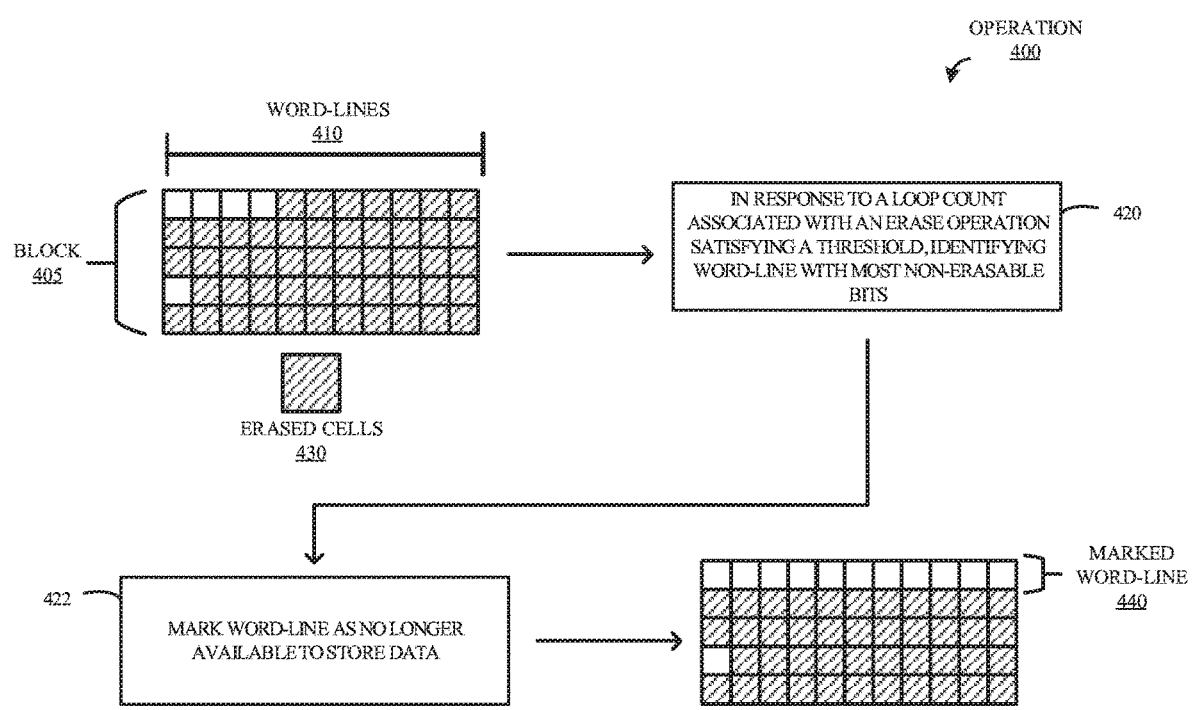
FIG. 4 illustrates an operational scenario of marking a word-line in a block according to an implementation.

FIG. 4 illustrates an operational scenario 400 of marking a word-line in a block according to an implementation. Operational scenario 400 includes block 405 with word-lines 410, wherein block 405 is stored in non-volatile storage media of a storage device, and further includes operations 420 and 422, which are representative of operations that are provided by a controller of the non-volatile storage media.

In operation, when blocks are erased in non-volatile storage media, a quantity of non-erasable bits (or in some examples non-erasable cells) is used to determine when the block reaches an erased state. Referring to the example in FIG. 4, block 405 reaches an erased state, although five cells of the block are not in the erased state. In particular, the controller for the non-volatile storage media may use a counter to determine the quantity of non-erasable bits that remain after each erasure loop of the storage media. When the quantity of non-erasable bits reaches the required value, then the block is considered erased, and no further erasure loops will be applied to the block.

Once the block is placed in the erased state, operation 420 is performed, wherein operation 420 directs a controller to, in response to the loop count associated with the erase operation satisfying a loop count threshold, identify a word-line in the block with the most non-erasable bits. Referring to the example in FIG. 4, the first work-line includes the most non-erasable cells (and bits) for the particular block. As a result, operation 422 will mark the first word-line. In some implementations, the mark may be used to identify the word-line as no longer available to store data. In other implementations, when the word-line is identified with the most non-erasable bits, the word-line may be marked so as not to be used in calculating the quantity of non-erasable bits during the next erasure of the block. Accordingly, when the block is required to be erased a second time, the controller may not count the bits within marked word-line 440 and instead count the number of non-erasable bits in the other word-lines of the block to determine when the block is placed into an erased state. In this manner, when a word-line has failed in the block, the word-line will no longer be used in making determinations about the health of the block.

Figure 5:
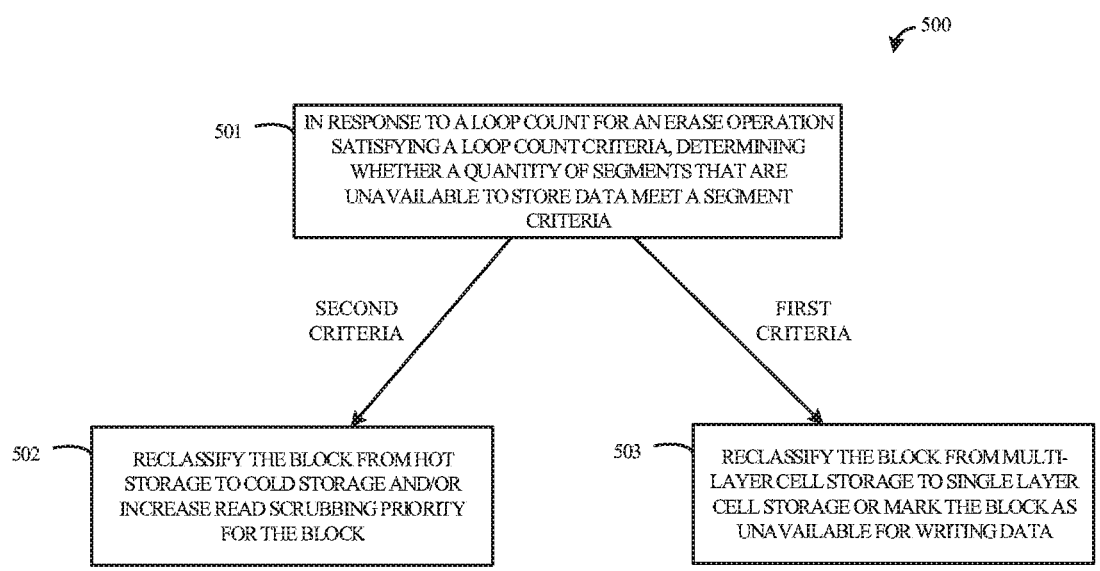
FIG. 5 illustrates an operation of classifying a block after satisfying a loop count criteria for an erase operation according to an implementation.

FIG. 5 illustrates an operation 500 of classifying a block after satisfying a loop count criteria for an erase operation according to an implementation. The processes of operation 500 are referenced parenthetically in the paragraphs that follow.

As described herein, when a block is erased in non-volatile storage media, a controller may monitor a loop count for the erasure of the block to reach an allowable quantity of non-erasable bits. Once the allowable quantity of non-erasable bits is attained, the controller then determines whether the loop count satisfies at least one loop count criterion, such as a threshold quantity of loops for the erasure. In response to the loop count satisfying the at least one criterion, operation 500 determines (501) whether a quantity of segments that are unavailable to store data meet segment criteria. Referring back to operational scenario 400 of FIG. 4, when a quantity of loops for an erasure meets a loop count criterion, the controller may identify a word-line or segment of the storage block with the highest or largest quantity of non-erasable bits. Once identified, the segment may be marked, such that the segment is no longer used to store data and/or such that the segment is no longer to be used in calculating the non-erasable bits of the block.

Here, when the quantity of segments or word-lines that are unavailable to store data and/or no longer used in the erasable bit calculation meet a first segment criteria, then the block is reclassified into a different type of storage. In particular, if the block meets first segment criteria, then the block may be reclassified (503) into a SLC block from a MLC block to increase the ability of using the block for storing any data, or may reclassify the block as unavailable for storing any data. As an example, if the portion or word-line criteria were three word-lines, then when a block is identified to have three portions or word-lines that were no longer available due to non-erasable bits, then the block may be reclassified from an available storage block to a non-available storage block, preventing future data from being stored in the block.

In another example, when a quantity of segments, such as word-lines, that are unavailable to store the data meet second segment criteria, then the block may be reclassified (502) from hot storage to cold storage and/or may have a read scrubbing priority increased for the block. For example, when the quantity of unavailable storage segments meet the second criteria (e.g. a quantity of segments equal to or less than two segments), the controller for the storage media may increase the scrubbing priority of the block to maintain the health of the block.

Although demonstrated in the example of FIG. 5 as identifying whether the quantity of segments meets one of two types of criteria, it should be understood that similar operations may be performed to determine whether the quantity of segments meet any number of criteria. As an example, when the quantity of unavailable word-lines is equal to one, the storage controller may increase read scrubbing for the block. Further, when the quantity of unavailable word-lines is equal to two, then the controller may reclassify the block from hot storage to cold storage of data in the storage device. This reclassification of the block may limit data that is accessed more frequently from being allocated to the block, wherein data that meets cold storage criteria (e.g. a limited number of accesses) may be stored to the block. Finally, when the quantity of unavailable word-lines is equal to three, the storage controller may mark the block as unavailable for writing data. While this is one example of using various unavailable word-line quantities in determining actions to be taken against a block, it should be understood that any unavailable word-line quantities may be used in performing actions against a block In some implementations, the operations that are described in FIG. 5 may be performed in addition to relaxing the health parameters that were described in FIGS. 1-4. For example, when a block fails to meet an erase loop count for the block, the storage controller may relax the quantity of allowable non-erasable bits for the block for a subsequent erasure. Additionally, the storage controller may identify the worst word-line for the erasure (i.e. the word-line with the most non-erasable bits), and classify that word-line as unavailable for storing data and/or no longer to be used in calculating the quantity of non-erasable bits. Once the worst word-line is identified, then the operations of FIG. 5 may be performed for the block. In this manner, various operations may be taken against the block to keep the block available for storing data.

FIGS. 6A-6D illustrate an operational scenario of erasing a block according to an implementation. FIGS. 6A-6D demonstrate the erasure of block 605 with segments (word-lines) 610, and sample cell 620, which is representative of a MLC block for data storage on the storage device.

Figure 6A:
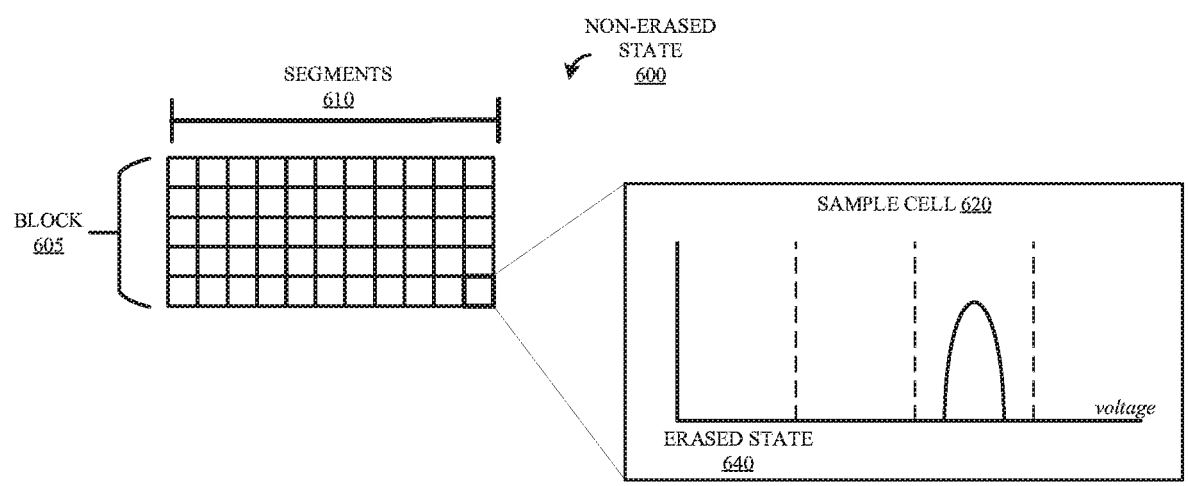
FIGS. 6A-6D illustrate an operational scenario of erasing a block according to an implementation.

Referring first to FIG. 6A, FIG. 6A demonstrates a block in a non-erased state 600 prior to an erasure operation. In particular, each of the cells may store one or more bits of data using transistors, wherein the data may be read from the cells by determining the voltage level of the cell. Here, sample cell 620 is provided that demonstrates a voltage in the third level for the cell, wherein the third level corresponds to bits values, such as "10" that can be provided to a host processing system.

Figure 6B:
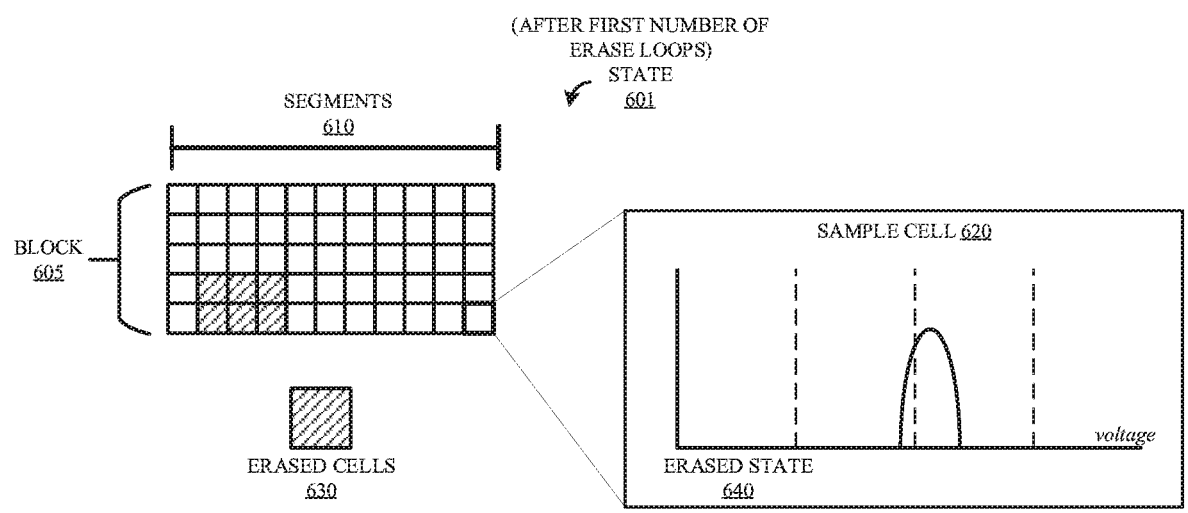

Turning to FIG. 6B, FIG. 6B demonstrates state 601 that is representative of the state of block 605 after a first number of erase loops of an erase operation. As described herein, when a block is to be erased, such as when the block is marked as no longer valid as part of a TRIM operation, erase loops are performed on cells of the block, wherein each loop applies voltage to the silicon substrate of the cells to transition the cells to an erased state, such as erased state 640 in sample cell 620. In the present example, after the application of the first number of erased loops, the voltage in sample cell 620 is moved to a lower state between voltage levels 2 and 3. However, because the voltage is still higher than the erased state 640, the block is not considered erased as part of erased cells 630.

Figure 6C:
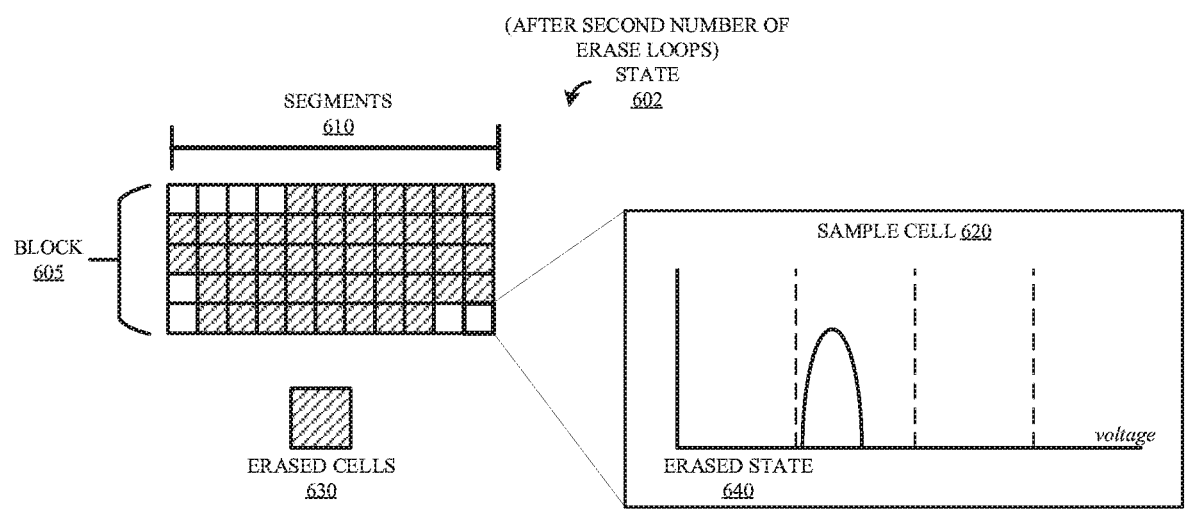

Moving to FIG. 6C, FIG. 6C demonstrates state 602 that is representative of the state of block 605 after a second number of erase loops of the erase operation. Here, as the erase loops are applied to each of the cells, the measured voltage of the cells may push the voltage of the cells to a different state. Using the example of sample cell 620, the voltage is lower in state 602 over state 601 as a result of the additional erase loops that are applied to the cell. Additionally, a greater quantity of erased cells 630 are present in state 602 over state 601 as a result of the additional erase loops.

Figure 6D:
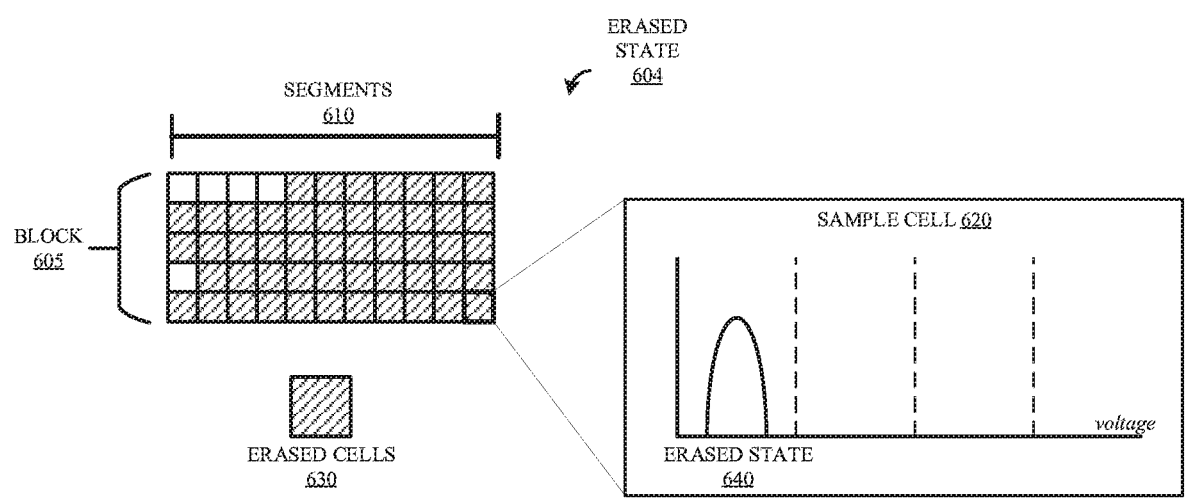

Referring now to FIG. 6D, FIG. 6D illustrates erased state 604 for block 605, wherein the erased state corresponds to when a quantity of non-erasable bits satisfies or meets an allowable non-erasable bits value. Here, the voltage of sample cell 620 has moved to an erased state due to the erase loops applied to the substrate of the cell. Once block 605 is placed in the erased state, the number of erase loops required to place the block in the erased state is compared to an erase loop threshold. In particular, when the erase loops do not meet or satisfy the erase loop threshold, then the block may be classified as healthy and no further operations are employed on the block. In contrast, if the quantity of erase loops meet or satisfy the erase loop threshold, the operations may be performed to modify the health metric of the block. These operations may include modifying the allowable non-erasable bits or cells for the block, identifying word-lines that should not be counted in determining the non-erasable bits in the block, or some other similar operation with the block. In some implementations, in addition to or in place of modifying a health metric for the block, the controller for block 605 may reclassify the block based on the block exceeding the required loop count. In particular, the controller may reclassify the block from hot storage to cold storage when the block meets criteria, may increase the data scrubbing when the block meets criteria, may transition the block from MLC type cell storage to SLC type cell storage when the block meets criteria, may mark the block as unavailable for storing data when the block meets criteria, or may provide some other similar operation for the block.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. An apparatus comprising:
   non-volatile storage media comprising blocks of memory bits; and
   control circuitry coupled to the non-volatile storage media, wherein the control circuitry comprises:
      a counter to maintain a loop count for an erasure of a block in the non-volatile storage media;
      a comparator to determine that the loop count satisfied a threshold loop count for the erasure of the block; and
      an adjuster to relax an erase parameter for a later erasure of the block in response to the loop count having satisfied the threshold loop count for the erasure;
   wherein the block comprises segments, and wherein the adjuster, in response to the loop count having satisfied the threshold loop count for the erasure, determines that a quantity of segments unavailable for storing data satisfies a segment criteria and, in response to the quantity of segments satisfying the segment criteria, increases a data scrubbing priority for the block.

2. The apparatus of claim 1 wherein the erase parameter comprises an allowable non-erasable bits value and wherein to relax the erase parameter for the later erasure of the block, the adjuster increases the allowable non-erasable bits value for a next erasure of the block.

3. The apparatus of claim 2 wherein the adjuster, in response to the loop count having satisfied the threshold loop count for the erasure, identifies a segment having a largest quantity of non-erasable bits and marks the segment as no longer available for storing data.

4. The apparatus of claim 1 wherein the adjuster, in response to the quantity of segments unavailable for storing data satisfying the segment criteria, changes a classification for the block from available hot storage to available cold storage.

5. The apparatus of claim 1 wherein the adjuster monitors a lifespan of the non-volatile storage media and triggers the comparator to determine that the loop count satisfied the threshold loop count when the non-volatile storage media reaches a mid-point in the lifespan.

6. The apparatus of claim 1 wherein the erasure comprises a program erase operation on cells in the block that store bits.

7. A storage device comprising:
non-volatile storage media comprising memory blocks; and
a controller configured to:
track a loop count for an erasure of one or more of the memory blocks;
after the erasure, determine that the loop count for the erasure did not exceed a threshold loop count for the erasure;
in response to determining that the loop count did not exceed the threshold loop count, reduce an allowed non-erasable bits parameter for a subsequent erasure of the one or more memory blocks;
identify one or more word-lines of a plurality of word-lines in a block of the one or more memory blocks as having a cluster of non-erasable bits that satisfies at least one criterion; and
designate the one or more word-lines as read-only.

8. The storage device of claim 7 wherein the controller is further configured to:
determine that a loop count for a previous erasure of a block of memory cells exceeded the threshold loop count; and
increase the allowable non-erasable bits threshold for the block of memory cells in response to the loop count having exceeded the threshold loop count.

9. The storage device of claim 7 wherein the controller is further configured to, in response to the loop count exceeding the threshold loop count, determine that a quantity of word-lines unavailable for storing data in the block satisfies word-line criteria, and in response to the quantity of word-lines unavailable for storing data in the block satisfying the word-line criteria, change a classification for the block from hot storage to cold storage.

10. The storage device of claim 9 wherein the controller is further configured to, in response to the quantity of word-lines unavailable for storing data in the in the block satisfying the word-line criteria, increase a data scrubbing priority for the block.

11. The apparatus of claim 7 wherein the erasure of a block of the one or more memory blocks comprises a program erase operation on the memory cells for the block.

12. A computing apparatus comprising:
a host processing system; and
a storage system coupled to the host processing system and configured to:
receive a trim command from the host processing system to initiate an erasure of a block of non-volatile storage media;
in response to the trim command, erase the block of the non-volatile storage media based on an allowable non-erasable bits value; and
modify the allowable non-erasable bits value for a subsequent erasure of the block in response to a loop count for the erasure having met at least one criterion;
wherein:
the block comprises segments,
the storage system is further configured to:
in response to the loop count meeting the at least one criterion, determine that a quantity of segments unavailable for storing data satisfies segment criteria, and
in response to the quantity of segments satisfying the segment criteria, increase a data scrubbing priority for the block.

13. The computing apparatus of claim 12 wherein to modify the allowable non-erasable bits value, the storage system increases the allowable non-erasable bits value for the subsequent erasure of the block.

14. The computing apparatus of claim 12 wherein to modify the allowable non-erasable bits value, the storage system decreases the allowable non-erasable bits value for the subsequent erasure of the block.

15. The computing apparatus of claim 12 wherein the storage system is further configured to, in response to the loop count meeting the at least one criterion, identify a segment of the block having a largest quantity of non-erasable bits, and designate the segment as no longer available for storing data.

16. An apparatus comprising:
a means for iteratively erasing a block of non-volatile storage media until a count of non-erasable bits satisfies an allowable non-erasable bits threshold;
a means for determining that a number of iterations needed to erase the block exceeds a threshold number of iterations; and
a means for increasing the allowable non-erasable bits value for at least one subsequent erasure of the block in response to the number of iterations exceeding the threshold number of iterations;
wherein:
the block comprises word-lines, and
the apparatus further comprises means for identifying at least one of the word-lines within which the non-erasable bits are clustered and marking the one of the word-lines as unavailable for writing data.

17. The apparatus of claim 16 further comprising:
a means for determining that the number of iterations needed to erase the block falls below the threshold number of iterations; and
a means for, in response to the number of iterations falling below the threshold number of iterations, decreasing the allowable non-erasable bits value for at least one subsequent erasure of the block.

* * * * *